(12) United States Patent
Yoshimura et al.

(10) Patent No.: US 7,514,205 B2
(45) Date of Patent: Apr. 7, 2009

(54) COMPOSITION FOR FORMING ANTIREFLECTION FILM, LAMINATE, AND METHOD FOR FORMING RESIST PATTERN

(75) Inventors: Nakaatsu Yoshimura, Tokyo (JP); Keiji Konno, Tokyo (JP); Norihiro Natsume, Tokyo (JP)

(73) Assignee: JSR Corporation, Tokyo (JP)

( * ) Notice: Subject to any disclaimer, the term of this patent is extended or adjusted under 35 U.S.C. 154(b) by 382 days.

(21) Appl. No.: 11/376,146

(22) Filed: Mar. 16, 2006

(65) Prior Publication Data

US 2006/0223008 A1    Oct. 5, 2006

(30) Foreign Application Priority Data

Mar. 17, 2005    (JP)    ............................. 2005-078127

(51) Int. Cl.
*G03F 1/00* (2006.01)
*C08F 20/26* (2006.01)

(52) U.S. Cl. ............... 430/322; 430/272.13; 430/273.1; 430/280.1; 430/287.1; 430/326; 526/318.42

(58) Field of Classification Search ................. 430/322, 430/326, 273.1, 272.1, 287.1, 280.1, 923, 430/925; 526/318.42
See application file for complete search history.

(56) References Cited

U.S. PATENT DOCUMENTS

| 5,229,229 | A | 7/1993 | Sato et al. |
| 2004/0072420 | A1 | 4/2004 | Enomoto et al. |

FOREIGN PATENT DOCUMENTS

| JP | 59-45439 | 3/1984 |
| JP | 60-52845 | 3/1985 |
| JP | 2-25850 | 1/1990 |
| JP | 7-234514 | 9/1995 |
| WO | 92/05474 | 4/1992 |

OTHER PUBLICATIONS

Mark W. Horn, "Antireflection Layers and Planarization for Microlithography", Solid State Technology, p. 57-62 (1991).
Ito, Hiroshi, "Advances in Resist Technology and Processing VIII," Proceedings of SPIE, vol. 1466, pp. 2-12, 1991.
Tanaka, T., "A new photolithography Technique with antireflective coating on resist: ARCOR," J. Electrochem. Soc., vol. 137(12), pp. 3900-3905, 1990.

*Primary Examiner*—Thorl Chea
(74) *Attorney, Agent, or Firm*—Ditthavong Mori & Steiner, P.C.

(57) ABSTRACT

An antireflection film-forming composition having excellent coatability, capable of significantly inhibiting production of fine microbubbles and capable of forming an antireflection film with a sufficiently decreased standing-wave effect, and having excellent solubility in water and alkaline developers is provided. The composition comprises a polymer having at least one polymerization unit with a hydroxyl group-containing organic group on the side chain, preferably a copolymer having at least one recurring unit of the following formula (2) and/or at least one recurring unit of the following formula (3) and at least one recurring unit of the following formula (4), and/or a salt thereof:

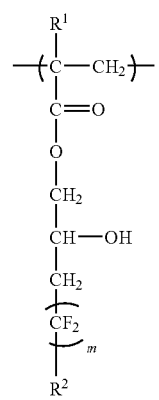

(2)

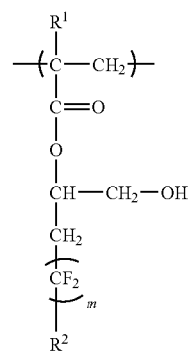

(3)

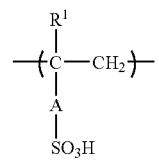

(4)

wherein $R^1$ and $R^2$ represent a hydrogen atom, a fluorine atom, or a monovalent organic group, m is an integer of 1-20, and A represents a divalent coupling means.

12 Claims, 1 Drawing Sheet

COMPOSITION FOR FORMING ANTIREFLECTION FILM, LAMINATE, AND METHOD FOR FORMING RESIST PATTERN

CROSS REFERENCE TO RELATED APPLICATIONS

This application claims priority to Japanese Patent Application No. 2005-078127, filed Mar. 17, 2005, the contents of which are hereby incorporated by reference in their entirety.

BACKGROUND OF THE INVENTION

1. Field of the Invention

The present invention relates to a composition for forming an antireflection film (an antireflection film-forming composition) suitable for microfabrication using a lithography process, in which a resist responding to various radiations such as a chemically amplified resist is used, a laminate with an antireflection film formed from the antireflection film-forming composition on a resist film, and a method for forming a resist pattern using the antireflection film-forming composition.

2. Description of Background Art

In the field of microfabrication represented by fabrication of integrated circuit devices, the processing size has become more and more minute in order to achieve higher integration in a lithographic process. In recent years, development of a lithographic process enabling stable microfabrication with a line width of 0.5 µm or less has been actively proceeding.

However, it is difficult to form such a fine pattern with high accuracy using a conventional method which utilizes visible rays (wavelength: 800-400 nm) or near ultraviolet rays (wavelength: 400-300 nm). To deal with this problem, a lithographic process using radiation with a shorter wavelength (wavelength: 300 nm or less) which can achieve a wider depth of focus and is effective for ensuring design rules with minimum dimensions has been proposed.

As a lithographic process using radiation with such a short wavelength, processes using deep ultraviolet rays such as a KrF excimer laser (wavelength: 248 nm) or an ArF excimer laser (wavelength: 193 nm), X-rays such as synchrotron radiation, and charged particle rays such as electron beams have been proposed. A chemically-amplified resist has attracted attention as a resist exhibiting high resolution for such short wavelength radiation. At present, development and improvement of the chemically amplified resist are important technical issues of the lithographic process.

The chemically-amplified resist contains a compound (a photoacid generator) which generates an acid upon irradiation (hereinafter called "exposure"). Chemical changes in the resist film (changes in polarity, breakage of a chemical bond, cross-linking reaction, etc.) caused by the catalytic action of an acid change solubility of the exposed area in a developer. A pattern is formed utilizing this phenomenon.

A number of compositions for chemically-amplified resists, for example, a combination of a resin containing an alkali-soluble resin, in which the groups exhibiting affinity with an alkali are protected by a t-butyl ester group or t-butoxy carbonyl group, with an acid generator (for example, Japanese Patent Publication No. 59-45439), a combination of a resin containing an alkali-soluble resin, in which the groups exhibiting affinity with an alkali are protected by a silyl group, with an acid generator (for example, Japanese Patent Publication No. 60-52845), a combination of an acetal group-containing resin with an acid generator (for example, Japanese Patent Publication No. 2-25850), a combination of an alkali-soluble resin, a dissolution controller, and an acid generator, a combination of a novolac resin, a crosslinking agent, and an acid generator; and the like have been proposed.

These chemically-amplified resists, however, have a problem with storage stability, because the compositions are easily affected by moisture, oxygen, basic substances, and the like which are present in the atmosphere of the lithographic process. SPIE, Vol. 1466, "Advance in Resist Technology and Processing", p. 2 (1991), for example, reports that a very small amount of dimethylaniline in the atmosphere deactivates acids existing near the surface of a resist film among the acids produced in the resist film by exposure, and forms a scarcely soluble layer on the surface of the film, which layer remains in the form of an eave-like projection on the surface of a resist pattern after development. Not only such a scarcely soluble layer decreases sensitivity and resolution of the resist, but also the eave-like projections formed in the resist pattern adversely affect the etching accuracy. The size of the eave-like projections tends to increase along with an increase of the time for which the resist is allowed to stand between each of the steps of exposure, post exposure baking, and development. This phenomenon is known as post exposure time delay (hereinafter referred to as "PED"), which unduly decreases the allowance of time in the lithographic process.

As a method for solving the problem of PED, a method of laminating an overcoat on the chemically-amplified resist film to block the film surface from the atmosphere has been proposed. For example, WO 92/05474 describes a method of laminating an overcoat of polyacrylic acid, polyvinyl butyral, polyvinyl alcohol, polystyrene sulfonic acid, or the like on the chemically-amplified resist film to inhibit invasion of basic materials into the resist film, thereby preventing a decrease of sensitivity and resolution of the resist. However, among such overcoats, polyacrylic acid, polyvinyl butyral, and polyvinyl alcohol cannot necessarily effectively prevent formation of the aforementioned scarcely-soluble layer, although they have a barrier effect. Polystyrene sulfonate, which has too strong acidity, has a drawback of initiating a chemical reaction due to the catalytic action of the acid in the chemically-amplified resist irrespective of exposure to light. Another problem of the overcoat, which is commonly applied to a resist film as an aqueous solution, is uneven coating due to insufficient wetting properties of the aqueous solution with the resist film.

On the other hand, since radiation commonly used in the lithographic process is light with a single wavelength, incidence radiation interferes with light reflected by the boundary surfaces on the top and bottom of the resist film. As a result, a phenomenon called "a standing-wave effect" or "a multiplex interference effect", which is a phenomenon in which an effectual dose of radiation to which a resist film is exposed fluctuates due to mutual interference of radiations in the film according to fluctuation of the resist film thickness, irrespective of a constant actual dose of radiation, occurs and adversely affects formation of resist patterns. If the coating thickness varies due to slight difference of a resist composition, viscosity, resist film conditions, and the like, or the coating thickness fluctuates due to steps in the substrates (recessed parts are thicker than projected parts), such a film thickness difference changes the effectual dose of radiation to which a resist film is exposed, resulting in fluctuation of pattern dimensions and a decrease in accuracy of the resist pattern dimensions.

To overcome this problem caused by the standing-wave effect, a method of forming an antireflection film on the resist film to inhibit reflection on the coating surface and reduce multiplex interference in the film has been proposed. For example, a method of reducing the standing-wave effect by laminating layers of polysiloxane, poly(ethyl vinyl ether), polyvinyl alcohol, or the like as an antireflection film on a resist film is described in J. Electrochem. Soc., Vol. 137, No. 12, p. 3,900 (1990). In this instance, the reflex inhibition effect on the surface of the resist film mainly depends on the refractive index and film thickness of the antireflection film.

The refractive index of an ideal antireflection film is the square root of n (n is the refractive index of the resist), and the thickness of an ideal antireflection film is an anisoploid of λ/4 m (wherein λ is the wavelength of radiation and m is the refractive index of the antireflection film).

However, the antireflection film made from polysiloxane, poly(ethyl vinyl ether), or polyvinyl alcohol has a basic problem of being incapable of sufficiently inhibiting the standing-wave effect due to the small difference of the refractive index with that of a resist film. In addition, the antireflection film made from polysiloxane which is insoluble in water or a developer must have a separate step of removing the antireflection film before development using an antireflection film removing agent. The solubility in water or a developer of poly(ethyl vinyl ether) or polyvinyl alcohol is not necessarily sufficient. The antireflection film made from these polymers may leave residues on the resist film which impair resist performance such as resolution, developability, pattern profile, and the like. An additional problem of the overcoat which is applied to a resist film as an aqueous solution such as poly(ethyl vinyl ether) or polyvinyl alcohol is uneven coating due to insufficient wetting properties of the aqueous solution with the resist film.

In order to solve the problems in conventional antireflection films mentioned above, the inventor of the present invention has proposed (a) a copolymer of an acrylamide compound such as 2-acrylamide-2-methylpropane sulfonic acid in which the amide group has a sulfonic acid group bonded to the nitrogen atom via an organic group, and a fluoroalkyl acrylate compound such as 2,2,3,3,3-pentafluoropropyl acrylate and (b) a basic material blocking antireflection film containing a fluoroalkylsulfonic acid having an fluoroalkyl group with 5-15 carbon atoms and/or a fluoroalkylcarboxylic acid having an fluoroalkyl group with 5-15 carbon atoms, and a resist pattern forming method using the antireflection film (see Japanese Patent Application Laid-open No. 7-234514). This antireflection film can reduce the effect of a basic substance in the atmosphere and the standing-wave effect. However, the composition used for forming the antireflection film has a problem in coatability onto a resist film, which results in production of micro-bubbles in the order of micrometers in the formed coating.

An object of the present invention is to provide an antireflection film-forming composition having excellent coatability, capable of significantly inhibiting production of fine micro-bubbles and capable of forming an antireflection film with a sufficiently decreased standing-wave effect, and having excellent solubility in water and alkaline developers, a laminate with an antireflection film formed from the antireflection film-forming composition on a resist film, and a method for forming a resist pattern using the composition for forming a basic material blocking antireflection film.

SUMMARY OF THE INVENTION

A first object of the present invention is to provide an antireflection film-forming composition comprising a polymer having at least one type of polymerization unit with a hydroxyl group-containing organic group on the side chain.

A second object of the present invention is to provide a laminate comprising a resist film and an antireflection film formed from the above antireflection film-forming composition on the resist film.

A third object of the present invention is to provide, in a process of forming a resist pattern by forming a resist film on the surface of a substrate, exposing the resist film to radiation, and developing the resist film, a method for forming a resist pattern comprising previously forming an antireflection film from the above antireflection film-forming composition on the resist film, exposing the resist film to radiation to form a prescribed pattern, developing the resist film, and removing the antireflection film.

DETAILED DESCRIPTION OF THE INVENTION AND PREFERRED EMBODIMENTS

Figure 1:
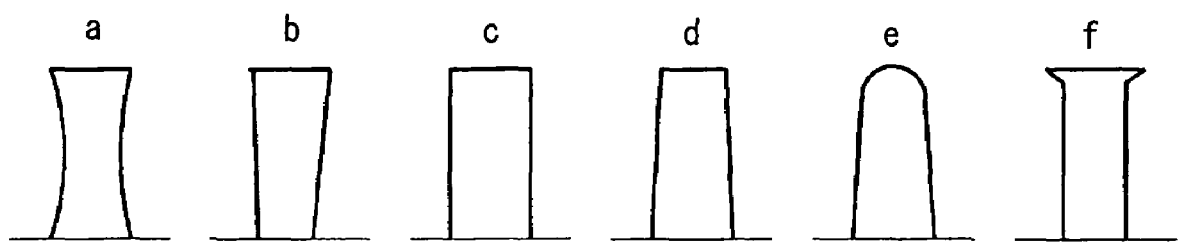
FIG. 1 shows an example of a cross-sectional shape of a pattern.

The present invention is described below in detail.

Antireflection Film-Forming Composition

<Polymer (A)>

The antireflection film-forming composition of the present invention comprises a polymer (hereinafter referred to as "polymer (A)") having at least one type of polymerization unit with a hydroxyl group-containing organic group on the side chain.

There are no specific limitations to the polymerization unit with a hydroxyl group-containing organic group on the side chain in polymer (A). Although such a unit may be an addition polymerization-type unit, polyaddition-type unit, or polycondensation-type unit, an addition polymerization-type unit (recurring unit) derived from a polymerizable unsaturated compound is preferable.

As a preferable example of polymer (A) having the recurring unit with a hydroxyl group-containing organic group on the side chain derived from a polymerizable unsaturated compound, a polymer having at least one recurring unit of the following formula (1) (hereinafter referred to as "recurring unit (1)") can be given. This polymer is hereinafter referred to as "polymer (A-I)".

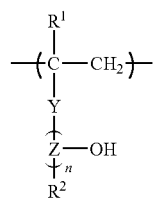

(1)

wherein $R^1$ and $R^2$ individually represent a hydrogen atom, a fluorine atom, or a monovalent organic group, Y is a divalent coupling means, Z is a trivalent organic group, and n is an integer of 1-20.

As the monovalent organic group represented by $R^1$ and $R^2$ in the formula (1), groups having 1-12 carbon atoms are preferable. Specific examples include: a carboxyl group; a cyano group; an alkyl group having 1-12 carbon atoms such as a methyl group, ethyl group, n-propyl group, i-propyl group, n-butyl group, i-butyl group, sec-butyl group, t-butyl group, n-pentyl group, and n-hexyl group; a carboxyalkyl group having 2-12 carbon atoms such as a carboxymethyl group, 2-carboxyethyl group, 2-carboxypropyl group, 3-carboxypropyl group, 2-carboxybutyl group, 3-carboxybutyl group, and 4-carboxybutyl group; an alkoxycarbonyl group having 2-12 carbon atoms such as a methoxycarbonyl group, ethoxycarbonyl group, n-propoxycarbonyl group, i-propoxycarbonyl group, n-butoxycarbonyl group, and t-butoxycarbonyl group; an acyloxy group having 2-12 carbon atoms such as an acetyloxy group, propionyloxy group, butanoyloxy group, and benzoyloxy group; an aryl group having 6-12 carbon atoms such as a phenyl group and cumenyl group; an aralkyl group having 7-12 carbon atoms such as a benzyl group and α-methylbenzyl group; an alkoxyl group having 1-12 carbon atoms such as a methoxy group, ethoxy group, n-propoxy group, i-propoxy group, n-butoxy group, and t-butoxy group; an alkoxyalkyl group having 2-12 carbon atoms such as a methoxymethyl group, ethoxymethyl group, 2-methoxyethyl group, 2-ethoxyethyl group, 2-methoxypropyl group, 3-methoxypropyl group, 2-methoxybutyl group, 3-methoxybutyl group, and 4-methoxybutyl group; a cycloalkyl group having 3-12 carbon atoms such as a cyclopentyl group, cyclohexyl group, cycloheptyl group, and cyclooctyl group; substitution derivatives of these groups; and the like.

A hydrogen atom, fluorine atom, methyl group, and the like are preferable as $R^1$ and $R^2$ in the formula (1).

As the divalent coupling means represented by Y, a single bond, a divalent hydrocarbon group or a substitution derivative thereof, wherein the position 1 carbon atom bonds to a carbon atom on the polymer main chain, hereinafter the same, —COO—, wherein the carbonyl group bonds to a carbon atom on the polymer main chain, hereinafter the same, —OCO—, wherein the oxygen atom on the left side bonds to a carbon atom on the polymer main chain, hereinafter the same, —CO—, —O—, —S—, or —N($R^3$)—, wherein $R^3$ represents a hydrogen atom or a monovalent organic group, —CONH—, wherein the carbonyl group bonds to a carbon atom on the polymer main chain, hereinafter the same, —NHCO—, wherein the nitrogen atom bonds to a carbon atom on the polymer main chain, hereinafter the same, —HN—CO—NH—, and the like can be given.

As examples of the divalent hydrocarbon group or the substitution derivative thereof, those having 1-12 carbon atoms are preferable. As specific examples, a methylene group, 1,2-ethylene group, 1,2-propylene group, 1,1-dimethyl-1,2-ethylene group, 1,3-propylene group, 1-methyl-1,3-propylene group, 2-methyl-1,3-propylene group, 1,4-butylene group, 1-methyl-1,4-butylene group, 2-methyl-1,4-butylene group, 1,5-pentylene group, 1,1-dimethyl-1,4-butylene group, 2,2-dimethyl-1,4-butylene group, 1,2-dimethyl-1,4-butylene group, 1,6-hexylene group, 1,3-cyclopentylene group, 1,4-cyclohexylene group, and the like can be given.

As examples of the monovalent organic group represented by $R^3$ in the formula —N($R^3$)—, the same groups as those previously mentioned for the monovalent organic group represented by $R^1$ and $R^2$ can be given.

As the divalent coupling means represented by Y, a divalent hydrocarbon group or a derivative thereof, —COO—, —OCO—, —CO—, —O—, —S—, —N($R^3$)—, —CONH—, —NHCO—, —HN—CO—NH—, and the like are preferable, with particularly preferable coupling means being —COO—, —OCO—, —CO—, —CONH—, and the like.

As examples of the trivalent organic group represented by Z, organic groups having 1-12 carbon atoms are preferable. Specific examples include groups derived from methane, ethane, propane, n-butane, i-butane, n-pentane, i-pentane, neopentane, 2-ethylpropane, n-hexane, cyclopentane, cyclohexane, and the like and substitution derivatives of these groups can be given.

n is preferably an integer of 1-6.

As specific examples of -(Z-OH)$_n$—$R^2$ in the formula (1), a hydroxymethyl group, 1-hydroxyethyl group, 2-hydroxyethyl group, 1-hydroxypropyl group, 2-hydroxypropyl group, 3-hydroxypropyl group, 1-methyl-1-hydroxyethyl group, 1-methyl-2-hydroxyethyl group, 1-(hydroxymethyl)ethyl group, 1-hydroxybutyl group, 2-hydroxybutyl group, 3-hydroxybutyl group, 4-hydroxybutyl group, 1-methyl-1-hydroxypropyl group, 1-methyl-2-hydroxypropyl group, 1-methyl-3-hydroxypropyl group, 1-(hydroxymethyl)propyl group, 2-(hydroxymethyl)propyl group, 1-methyl-1-(hydroxymethyl)ethyl group, 1-methyl-2-(hydroxymethyl)ethyl group, 1-hydroxypentyl group, 2-hydroxypentyl group, 3-hydroxypentyl group, 4-hydroxypentyl group, 5-hydroxypentyl group, 1-methyl-1-hydroxybutyl group, 1-methyl-2-hydroxybutyl group, 1-methyl-3-hydroxybutyl group, 1-methyl-4-hydroxybutyl group, 1-(hydroxymethyl)butyl group, 2-(hydroxymethyl)butyl group, 3-(hydroxymethyl)butyl group, 1-methyl-1-(hydroxymethyl)propyl group, 1-methyl-2-(hydroxymethyl)propyl group, 1-methyl-3-(hydroxymethyl)propyl group, 1-hydroxyhexyl group, 2-hydroxyhexyl group, 3-hydroxyhexyl group, 4-hydroxyhexyl group, 5-hydroxyhexyl group, 6-hydroxyhexyl group, 1-methyl-1-hydroxypentyl group, 1-methyl-2-hydroxypentyl group, 1-methyl-3-hydroxypentyl group, 1-methyl-4-hydroxypentyl group, 1-methyl-5-hydroxypentyl group, 1-(hydroxymethyl)pentyl group, 2-(hydroxymethyl)pentyl group, 3-(hydroxymethyl)pentyl group, 4-(hydroxymethyl)pentyl group, 1-methyl-1-(hydroxymethyl)butyl group, 1-methyl-2-(hydroxymethyl)butyl group, 1-methyl-3-(hydroxymethyl)butyl group, 1-methyl-4-(hydroxymethyl)butyl group, 3-hydroxycyclopentyl group, 4-hydroxycyclohexyl group, and the like can be given.

Of these groups represented by -(Z-OH)$_n$—$R^2$, 3-hydroxypropyl group, 1-methyl-2-hydroxyethyl group, and the like are particularly preferable.

As particularly preferable examples of polymer (A-I) in the present invention, a copolymer having at least one recurring unit of the following formula (2) (hereinafter referred to as "recurring unit (2)") and/or at least one recurring unit of the following formula (3) (hereinafter referred to as "recurring unit (3)") and at least one recurring unit of the following formula (4) (hereinafter referred to as "recurring unit (4)") (this copolymer is hereinafter referred to as "polymer (A-II)") and/or a salt of polymer (A-II) can be given:

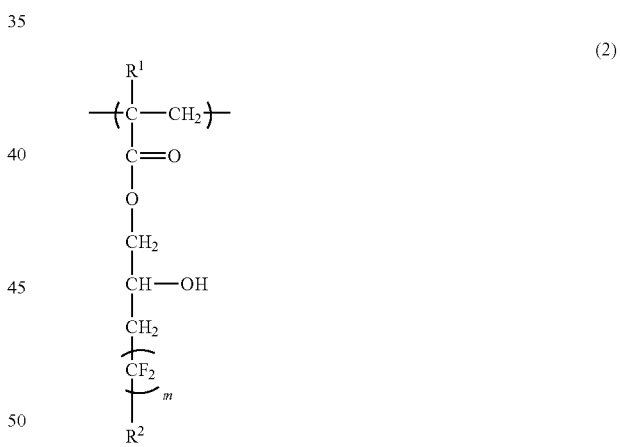

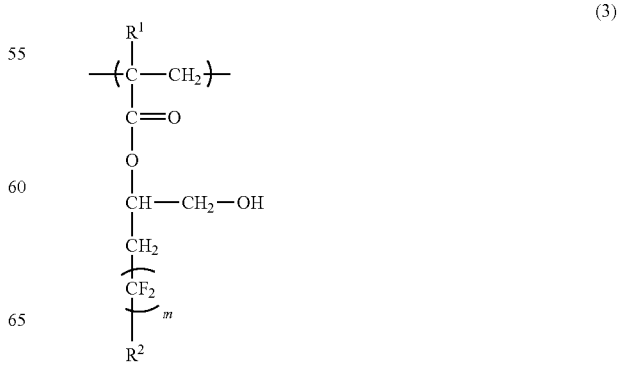

wherein R¹ and R² individually represent a hydrogen atom, a fluorine atom, or a monovalent organic group and m is an integer of 1-20;

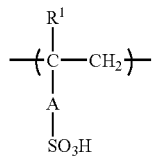

(4)

wherein R¹ represents a hydrogen atom, a fluorine atom, or a monovalent organic group and A represents a divalent coupling means.

As examples of the monovalent organic group represented by R¹ and R² in the formulas (2) and (3), the same groups as those previously mentioned for the monovalent organic group R¹ and R² in the formula (1) can be given.

A hydrogen atom, fluorine atom, methyl group, and the like are preferable as R¹ and R² in the formulas (2) and (3).

m in the formulas (2) and (3) is preferably an integer of 1-20.

As examples of the monovalent organic group represented by R¹ in the formula (4), the same groups as those previously mentioned for the monovalent organic group R¹ in the formula (1) can be given.

As the group R¹ in the formula (4), a hydrogen atom, fluorine atom, methyl group, and the like are preferable.

As the divalent coupling means represented by A, a single bond, a divalent hydrocarbon group or a substitution derivative thereof, wherein the position 1 carbon atom bonds to a carbon atom on the polymer main chain, hereinafter the same, —COO-A'-, wherein A' is a divalent hydrocarbon group or a derivative thereof, hereinafter the same, and the carbonyl group bonds to a carbon atom on the polymer main chain, hereinafter the same, —OCO-A'-, wherein the oxygen atom on the left side bonds to a carbon atom on the polymer main chain, hereinafter the same, —CO-A'-, wherein the carbonyl group bonds to a carbon atom on the polymer main chain, hereinafter the same, —O-A'-, wherein the oxygen atom bonds to a carbon atom on the polymer main chain, hereinafter the same, —S-A'-, wherein the sulfur atom bonds to a carbon atom on the polymer main chain, hereinafter the same, —N(R³)-A'-, wherein R³ represents a hydrogen atom or a monovalent organic group and the nitrogen atom bonds to a carbon atom on the polymer main chain, hereinafter the same, —CONH-A'-, wherein the carbonyl group bonds to a carbon atom on the polymer main chain, hereinafter the same, —NHCO-A'-, wherein the nitrogen atom bonds to a carbon atom on the polymer main chain, hereinafter the same, —NH—CO—NH-A'-, wherein the nitrogen atom on the left side bonds to a carbon atom on the polymer main chain, hereinafter the same, and the like can be given.

As examples of the divalent hydrocarbon group or the substitution derivative thereof represented by A and A', those having 1-12 carbon atoms are preferable. As specific examples, a methylene group, 1,2-ethylene group, 1,2-propylene group, 1,1-dimethyl-1,2-ethylene group, 1,3-propylene group, 1-methyl-1,3-propylene group, 2-methyl-1,3-propylene group, 1,4-butylene group, 1-methyl-1,4-butylene group, 2-methyl-1,4-butylene group, 1,5-pentylene group, 1,1-dimethyl-1,4-butylene group, 2,2-dimethyl-1,4-butylene group, 1,2-dimethyl-1,4-butylene group, 1,6-hexylene group, 1,3-cyclopentylene group, 1,4-cyclohexylene group, and the like can be given.

As examples of the monovalent organic group represented by R³ in the formula —N(R³)—, the same groups as those previously mentioned for the monovalent organic group represented by R¹ and R² in the above formula (1) can be given.

As the divalent coupling means represented by A in the formula (4), a single bond, methylene group, 1,1-dimethylethylene group, 2-methyl-1,3-propylene group, and the like are preferable.

As examples of the polymerizable unsaturated compound producing the recurring unit (2), 3-(perfluoro-n-butyl)-2-hydroxypropyl(meth)acrylate, 3-(perfluoro-n-hexyl-2-hydroxypropyl(meth)acrylate, 3-perfluoro-n-octyl-2-hydroxypropyl(meth)acrylate, 3-(perfluoro-3-methylbutyl)-2-hydroxypropyl(meth)acrylate, 3-(perfluoro-5-methylhexyl)-2-hydroxypropyl(meth)acrylate, 3-(perfluoro-7-methyloctyl)-2-hydroxypropyl(meth)acrylate, and the like can be given.

Among these polymerizable unsaturated compounds producing the recurring unit (2), 3-(perfluoro-n-butyl)-2-hydroxypropyl(meth)acrylate, 3-(perfluoro-n-hexyl-2-hydroxypropyl(meth)acrylate, 3-perfluoro-n-octyl-2-hydroxypropyl(meth)acrylate, and the like are preferable.

As examples of the polymerizable unsaturated compound producing the recurring unit (3), 2-(perfluoro-n-butyl)-1-(hydroxymethyl)ethyl(meth)acrylate, 2-(perfluoro-n-hexyl)-1-(hydroxymethyl)ethyl(meth)acrylate, 2-(perfluoro-n-octyl)-1-(hydroxymethyl)ethyl(meth)acrylate, 2-(perfluoro-3-methylbutyl)-1-(hydroxymethyl)ethyl(meth)acrylate, 2-(perfluoro-5-methylhexyl)-1-(hydroxymethyl)ethyl(meth)acrylate, 2-(perfluoro-7-methyloctyl)-1-(hydroxymethyl)ethyl(meth)acrylate, and the like can be given.

Among these polymerizable unsaturated compounds producing the recurring unit (3), 2-(perfluoro-n-butyl)-1-(hydroxymethyl)ethyl(meth)acrylate, 2-(perfluoro-n-hexyl)-1-(hydroxymethyl)ethyl(meth)acrylate, 2-(perfluoro-n-octyl)-1-(hydroxymethyl)ethyl(meth)acrylate, and the like are particularly preferable.

As examples of the polymerizable unsaturated compound producing the recurring unit (4), vinylsulfonic acid, allylsulfonic acid, 2-(meth)acrylamide-2-methylpropanesulfonic acid, 2-(α-carboxyacrylamide)-2-methylpropanesulfonic acid, 2-(α-carboxymethylacrylamide)-2-methylpropanesulfonic acid, 2-(α-methoxycarbonylacrylamide)-2-methylpropanesulfonic acid, 2-(α-cyclohexylacrylamide)-2-methylpropanesulfonic acid, 2-(α-phenylacrylamide)-2-methylpropanesulfonic acid, 2-(α-benzylacrylamide)-2-methylpropanesulfonic acid, 2-(α-methoxyacrylamide)-2-methylpropanesulfonic acid, 2-[α-(2-methoxyethyl)acrylamide]-2-methylpropanesulfonic acid, 2-(α-acetyloxyacrylamide)-2-methylpropanesulfonic acid, 2-α-cyanoacrylamide-2-methylpropanesulfonic acid, and the like can be given.

Of these polymerizable unsaturated compounds producing the recurring unit (4), vinylsulfonic acid, allylsulfonic acid, 2-acrylamide-2-methylpropanesulfonic acid, and the like are preferable, with a particularly preferable polymerizable unsaturated compound being 2-acrylamide-2-methylpropanesulfonic acid.

The copolymerization ratio of the recurring units (2)-(4) in the polymer (A-II) is such that the total amount of the recurring units (2) and (3) is usually 1-99 wt %, preferably 50-97 wt %, and particularly preferably 70-95 wt %, with the amount of the recurring unit (4) being usually 99-1 wt %, preferably 50-3 wt %, and particularly preferably 30-5 wt %. If the total amount of the recurring units (2) and (3) is less than 1 wt % and the amount of the recurring unit (4) is more than 99 wt %, the standing-wave effect will not be sufficiently inhibited, film-forming properties may be impaired, or the acidity is so strong that resist film may have a risk of being dissolved. If the total amount of the recurring units (2) and (3) is more than 99 wt % and the amount of the recurring unit (4) is less than 1 wt %, the solubility of the resulting antireflection film in water and an alkaline developer may decrease, inducing a tendency of impairing the pattern profile and developability.

In the present invention, the polymer (A-I) and polymer (A-II) can be manufactured by polymerizing a polymerizable unsaturated compound producing the recurring unit (1), or recurring units (2)-(4), optionally together with other copolymerizable unsaturated compounds. It is also possible to manufacture the polymer (A-I) and polymer (A-II) by a chemical post treatment of an appropriate precursor polymer. The amount of the other polymerizable unsaturated compounds used in the former method is usually 50 wt % or less, and preferably 40 wt % or less of the total amount of the polymerizable unsaturated compounds.

Examples of such other polymerizable unsaturated compounds include: unsaturated monocarboxylic acids such as (meth)acrylic acid, α-methoxyacrylic acid, crotonic acid, cinnamic acid, atropic acid, 3-acetyloxy(meth)acrylic acid, 3-benzoyloxy(meth)acrylic acid, 3-cyclohexyl(meth)acrylic acid; esters of unsaturated monocarboxylic acid such as alkyl (meth)acrylates (e.g. methyl (meth)acrylate, ethyl(meth) acrylate, n-propyl(meth)acrylate, and n-butyl(meth)acrylate), methyl crotonate, and methyl cinnamate; unsaturated polycarboxylic acids such as fumaric acid, maleic acid, citraconic acid, mesaconic acid, itaconic acid, and the like, or their anhydrides; mono- or diesters such as mono- or dimethyl ester, mono- or diethyl ester, mono- or di-n-propyl ester, and the like of the above unsaturated polycarboxylic acids; esters of unsaturated alcohol such as vinyl acetate, vinyl propionate, and vinyl caprate; vinyl cyanide compounds such as (meth) acrylonitrile, α-methylacrylonitrile, α-chloroacrylonitrile, α-(chloromethyl)acrylonitrile, α-(trifluoromethyl)acrylonitrile, and vinylidene cyanide; aromatic monovinyl compounds such as styrene, α-methylstyrene, vinyl toluene; halogenated olefins such as vinyl chloride, vinylidene chloride, vinyl fluoride, vinylidene fluoride, tetrafluoroethylene, hexafluoropropylene; diene compounds such as butadiene, isoprene, chloroprene, piperylene, 2,3-dimethylbutadiene, methylpentadiene, cyclopentadiene, vinylcyclohexene, ethylidenenorbornene, divinylbenzene, and dimethylvinylstyrylsilane; unsaturated ether compounds such as methyl vinyl ether, ethyl vinyl ether, and methyl allyl ether; epoxy group-containing unsaturated compounds such as glycidyl(meth) acrylate and allyl glycidyl ether; halogen-containing unsaturated compounds other than the above-described halogen-containing unsaturated compounds such as 2-chloroethyl vinyl ether, vinyl chloroacetate, allyl chloroacetate, and p-(chloromethyl)styrene; hydroxyl group-containing unsaturated compounds such as 2-hydroxyethyl(meth)acrylate, 2-hydroxypropyl (meth)acrylate, o-hydroxystyrene, m-hydroxystyrene, p-hydroxystyrene, N-methylol(meth)acrylamide, 2-propenyl alcohol, and 2-methyl-2-propenyl alcohol; amide group-containing unsaturated compounds such as (meth)acrylamide, crotonic acid amide, and cinnamic acid amide; and carboxyl group-containing unsaturated compounds other than those mentioned above such as mono[2-(meth)acryloyloxyethyl] succinate, mono[2-(meth)acryloyloxyethyl] phthalate, mono[2-(meth)acryloyloxyethyl] hexahydrophthalate, mono[2-(meth)acryloyloxyethyl] maleate, and compounds of the following formula (5) (hereinafter referred to as "acrylamide derivatives (5)":

wherein $R^4$ is a hydrogen atom or a monovalent organic group and $R^5$ is a divalent organic group.

As examples of the monovalent organic group represented by $R^4$ in the formula (5), the same groups as those previously given for the monovalent organic group $R^1$ in the formula (1) can be given. As examples of the divalent organic group represented by $R^5$ in the formula (5), the same divalent hydrocarbon groups or their substitution derivatives as those previously given for Y in the formula (1) can be given.

As specific examples of the acrylamide derivatives (5), 2-(meth)acrylamide-2-methylpropanecarboxylic acid, 2-(α-carboxyacrylamide)-2-methylpropanecarboxylic acid, 2-[α-(carboxymethyl)acrylamide]-2-methylpropanecarboxylic acid, 2-[α-(methoxycarbonyl)acrylamide]-2-methylpropanecarboxylic acid, 2-(α-cyclohexylacrylamide)-2-methylpropanecarboxylic acid, 2-(α-phenylacrylamide)-2-methylpropanecarboxylic acid, 2-(α-benzylacrylamide)-2-methylpropanecarboxylic acid, 2-(α-methoxyacrylamide)-2-methylpropanecarboxylic acid, 2-[α-(2-methoxyethyl)acrylamide]-2-methylpropanecarboxylic acid, 2-[α-(acetyloxy)acrylamide]-2-methylpropanecarboxylic acid, and 2-(α-cyanoacrylamide)-2-methylpropanecarboxylic acid can be given.

Of these other polymerizable unsaturated compounds, alkyl(meth)acrylates, acrylamide derivatives (5), and the like are preferable, with particularly preferable compounds being methyl(meth)acrylate, ethyl(meth)acrylate, and acrylamide derivatives of 2-(meth)acrylamide-2-methylpropanecarboxylic acid.

In the present invention, the above other polymerizable unsaturated compounds can be used either individually or in combination of two or more.

Radical polymerization, anionic polymerization, cationic polymerization, coordination polymerization, or the like using an appropriate process such as a mass polymerization process, suspension polymerization process, mass-suspension polymerization process, emulsion polymerization process, solution polymerization process, precipitation polymerization process, or the like can be used for manufacturing the polymer (A-I) or (A-II). The reaction components such as various polymerizable unsaturated compounds, polymerization initiators, and the like used for the copolymerization may be added at one time, may be added portion by portion in several times, or may be added continuously.

The salt of the polymer (A-II) is a polymer in which at least a part of sulfonic acid groups in the recurring unit (4) is neutralized.

The salt of the polymer (A-II) can be prepared, for example, (a) by neutralizing the polymer (A-II) with an alkaline compound or (b) by copolymerizing a polymerizable unsaturated compound for producing the recurring unit (4), after neutralizing at least part of the sulfonic acid groups with an alkaline compound, with a polymerizable unsaturated compound for producing the recurring unit (2) and/or a polymerizable unsaturated compound for producing the recurring unit (3), and, optionally, other polymerizable unsaturated compounds.

When there are acidic groups other than sulfonic acid groups in the recurring unit (4) in the above method (a), at least a part of such other acidic groups may be neutralized. In the above method (b), when there are acidic groups in other polymerizable unsaturated compounds, at least a part of such acidic groups may be previously neutralized.

In the present invention, the salt of the polymer (A-II) is preferably prepared by, for example, adding the polymer (A-II) to an aqueous solution of an alkaline compound and mixing the mixture according to the above method (a).

Ammonia and/or organic amines are preferable as the alkaline compound used for producing the salt of the polymer (A-II) in the present invention.

As examples of the organic amines: primary, secondary, or tertiary monovalent amines such as methylamine, ethylamine, n-propylamine, n-butylamine, dimethylamine, diethylamine, di-n-propylamine, di-n-butylamine, trimethylamine, triethylamine, tri-n-propylamine, tri-n-butylamine, ethanolamine, aminomethylpropanol, 2-dimethylethanolamine, diethanolamine, triethanolamine, cyclohexylamine, pyrrole, pyrrolidine, oxazole, pyridine, piperidine, and morpholine; primary, secondary, or tertiary polyvalent amines such as ethylenediamine, diethylenediamine, tetraethylenediamine, diethylenetriamine, tetraethylenetriamine, imidazole, imidazolydin, oxazole, pyrazine, piperazine, and s-triazine; and the like can be given.

Of these organic amines, monovalent or polyvalent tertiary organic amines are preferable.

These organic amines may be used either individually or in combination of two or more.

As the alkaline compound, ammonia and monovalent tertiary amines are particularly preferable in the present invention.

The neutralization degree of the salt of polymer (A-II), in terms of the neutralized sulfonic acid groups in the recurring unit (4), is usually 5-100 mol %, and preferably 30-90 mol % in the present invention.

The polymer (A-II) may have various structure such as a random copolymer, a block copolymer, a graft copolymer, and the like. In the case of the block copolymer, the recurring unit (2) and/or the recurring unit (3) and the recurring unit (4) may be present in either the same polymer block or different polymer blocks. In the case of the graft copolymer, both of the recurring unit (2) and/or the recurring unit (3) and the recurring unit (4) may be present in a trunk polymer and/or a branch polymer, or the recurring unit (2) and/or the recurring unit (3) may be present in either a trunk polymer or a branch polymer.

The polystyrene-reduced weight average molecular weight (hereinafter referred to as "Mw") of the polymer (A) in the present invention is usually 1,000-1,000,000, preferably 1,500-500,000, and particularly preferably 2,000-100,000. If the Mw of the polymer (A) is less than 1,000, coatability and film-forming ability during formation of antireflection film tend to decrease. If the Mw exceeds 1,000,000, solubility in water or an alkaline developer, coatability, and the like tend to decrease.

In the present invention, either one polymer (A) may be used or two or more polymers (A) may be used in combination.

<Additives>

Various additives may be added to the antireflection film-forming composition of the present invention inasmuch as the intended effect of the present invention is not adversely affected.

As the additives, surfactants, other water-soluble polymers, alkali-soluble polymers, acid generators, and the like can be given.

As the surfactant, surfactants with a solubility in water at 20° C. of 0.01 wt % or more, and particularly 0.03 wt % or more, are preferably used.

Any surfactants satisfying this solubility conditions, including anionic surfactants, nonionic surfactants, cationic surfactants, and amphoteric surfactants, may be used without any specific limitations. Examples include surfactants commercially available under the trade names of Surflon S-111, Surflon S-112, Surflon S-113, Surflon S-121, Surflon S-131, Surflon S-132, Surflon S-141, Surflon S-145, Surflon S-381, Surflon S-383, Surflon S-393, Surflon KH-40, and Surflon SA-100 (manufacture by SEIMI CHEMICAL Co., Ltd.), Ftergent 100, Ftergent 100C, Ftergent 110, Ftergent 140A, Ftergent 150, Ftergent 150CH, Ftergent 222F, Ftergent 250, Ftergent 251, Ftergent 300, Ftergent 310, Ftergent 400SW, Ftergent 501, Ftergent A-K, and Ftergent FTX-218 (manufacture by Neos Co., Ltd.), FFTOP EF-101, FFTOP EF-102, FFTOP EF-103, FFTOP EF-104, FFTOP EF-105, FFTOP EF-112, FFTOP EF-121, FFTOP EF-122A, FFTOP EF-122B, FFTOP EF-122C, FFTOP EF-123A, FFTOP EF-123B, FFTOP EF-125M, FFTOP EF-132, FFTOP EF-135M, FFTOP EF-201, FFTOP EF-204, FFTOP EF-351, FFTOP EF-352, FFTOP EF-601, FFTOP EF-801, and FFTOP EF-802 (manufactured by JEMCO Inc.), Surfynol 61, Surfynol 82, Surfynol 104, Surfynol 420, Surfynol 440, Surfynol 465, Surfynol 504, Surfynol 2502, Surfynol SE, Surfynol SE-F, Dynol 75, Dynol 210, Dynol 604, Dynol DF37, Dynol DF58, Dynol DF110D, E1004, E1010, PD-001, PD-002W, PD-004, EXP.4001, EXP.4036, EXP.4051, and SPC (manufactured or supplied by Nissin Chemical Industry Co., Ltd.), Fluorad FC-4430 (supplied by Sumitomo 3M Ltd.), and the like.

Of these surfactants, Surflon S-141, Surflon S-145, Surflon S-381, Surflon S-383, Ftergent 222F, Ftergent 250, Ftergent 251, FFTOP EF-122A, FFTOP EF-122B, FFTOP EF-122C, Surfynol 104, Surfynol 420, Surfynol 440, Surfynol 465, Dynol 604, and the like are preferable.

These surfactants may be used either individually or in combination of two or more.

The surfactant is added in an amount of preferably 0.001-50 wt %, and still more preferably 0.002-30 wt % for the amount of the polymer (A).

As examples of the other water-soluble polymer and alkali-soluble polymer, polyvinyl alcohol, polymethyl vinyl ether, polyethyl vinyl ether, polyethylene glycol, ammonium polyacrylate, sodium polyacrylate, polyhydroxystyrene or its derivative, styrene-maleic anhydride copolymer or its hydrolyzate, polyvinylhydroxy benzoate, carboxyl group-containing (meth)acrylic resin, and the like can be given.

These other water-soluble polymers and alkali-soluble polymers may be used either individually or in combination of two or more.

The amount of the other water-soluble polymers and/or alkali-soluble polymers to be added is usually 200 parts by weight or less, and preferably 100 parts by weight or less for 100 parts by weight of the polymer (A).

The acid generator is a component exhibiting the effects of improving a resist pattern profile, resolution, developability, and the like.

As examples of the acid generator, onium salts, haloalkyl group-containing compounds, o-quinonediazido compounds, nitrobenzyl compounds, sulfonate compounds, sulfone compounds, and the like can be given.

As examples of the onium salt, compounds of the following formulas (6), (7), or (8) can be given:

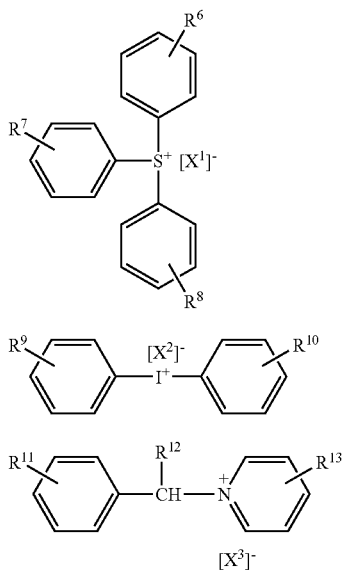

(6)

(7)

(8)

wherein $R^6$, $R^7$, $R^8$, $R^9$, $R^{10}$, $R^{11}$, $R^{12}$, and $R^{13}$ individually represent a hydrogen atom, amino group, nitro group, cyano group, alkyl group, or alkoxyl group, and $X^1$, $X^2$, and $X^3$ individually represent $SbF_6$, $AsF_6$, $PF_6$, $BF_4$, $ClO_4$, $CF_3CO_2$, $CF_3SO_3$,

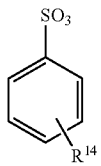

wherein $R^{14}$ indicates a hydrogen atom, amino group, nitro group, cyano group, alkyl group, or alkoxyl group,

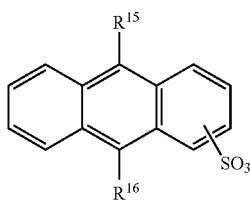

wherein $R^{15}$ and $R^{16}$ are individually an alkoxyl group,

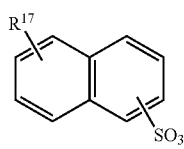

wherein $R^{17}$ represents a hydrogen atom, amino group, anilino group, alkyl group, or alkoxyl group, or

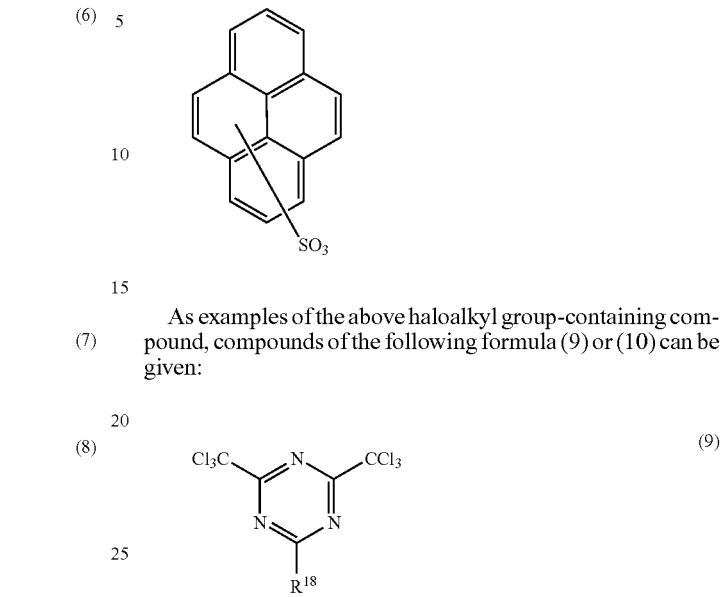

As examples of the above haloalkyl group-containing compound, compounds of the following formula (9) or (10) can be given:

(9)

wherein $R^{18}$ represents a trichloromethyl group, phenyl group, 4-methoxyphenyl group, 1-naphthyl group, or 4-methoxy-1-naphthyl group, or

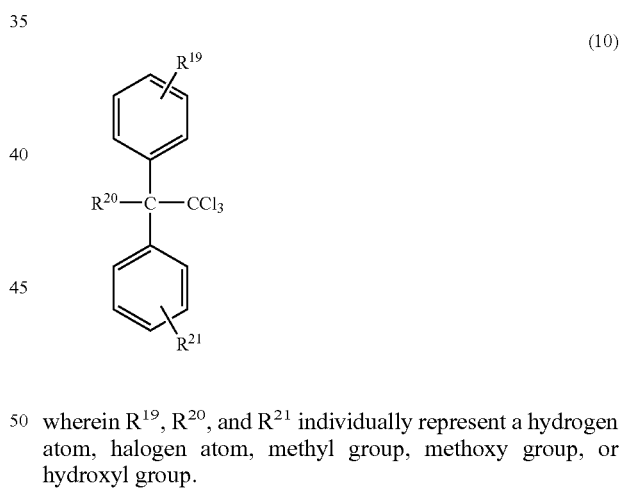

(10)

wherein $R^{19}$, $R^{20}$, and $R^{21}$ individually represent a hydrogen atom, halogen atom, methyl group, methoxy group, or hydroxyl group.

As examples of the above o-quinonediazido compound, compounds of the following formula (11) or (12) can be given:

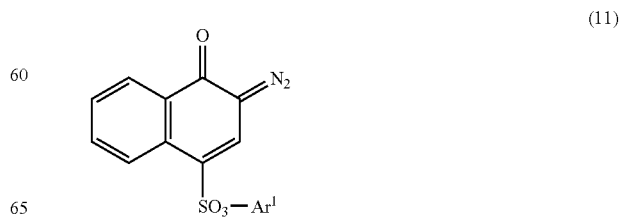

(11)

wherein Ar¹ represents:

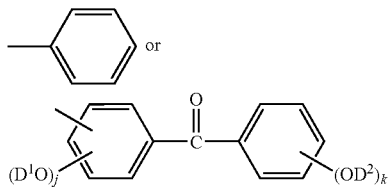

wherein $D^1$ and $D^2$ individually represent a hydrogen atom or 1,2-naphthoquinonediazido-4-sulfonyl group, and j and k individually represent an integer of 0-3, provided that both j and k are not 0 at the same time and two or more $D^1$ or $D^2$ that may present may be either the same or different, or

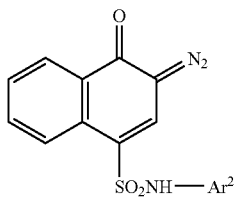

(12)

wherein $Ar^{12}$ represents:

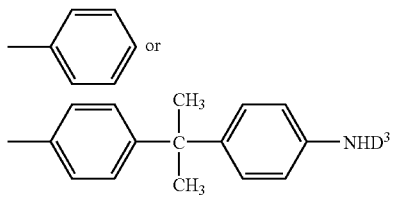

wherein $D^3$ is a hydrogen atom or 1,2-naphthoquinonediazido-4-sulfonyl group.

As examples of the nitrobenzyl compound, compounds of the following formula (13) can be given:

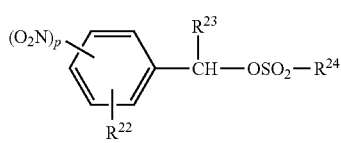

(13)

wherein p is an integer of 1-3, $R^{22}$ represents an alkyl group, $R^{23}$ represents a hydrogen atom or an alkyl group, and $R^{24}$ represents:

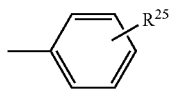

wherein $R^{25}$ is a hydrogen atom or an alkyl group,

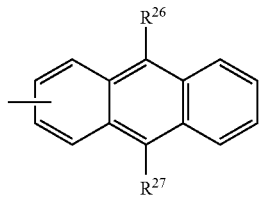

wherein $R^{26}$ and $R^{27}$ are individually an alkoxyl group, or

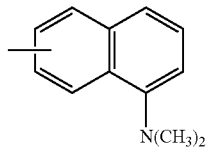

As examples of the sulfonate compound, compounds of the following formula (14), (15), (16), or (17) can be given:

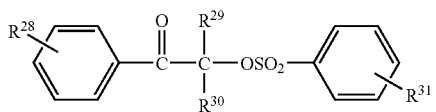

(14)

wherein $R^{28}$ and $R^{31}$ individually represent a hydrogen atom or an alkyl group, and $R^{29}$ and $R^{30}$ individually represent a hydrogen atom, an alkyl group, or an aryl group,

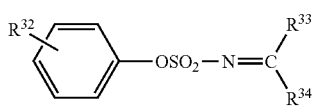

(15)

wherein $R^{32}$ represents a hydrogen atom or an alkyl group, and $R^{33}$ and $R^{34}$ individually represent an alkyl group or an aryl group, or $R^{33}$ and $R^{34}$ mutually bond to form a cyclic structure,

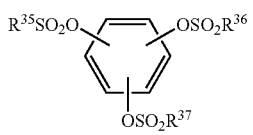

(16)

wherein $R^{35}$, $R^{36}$, and $R^{37}$ individually represent a methyl group, trifluoromethyl group, trichloromethyl group, phenyl group, tolyl group, cyanophenyl group, trichlorophenyl group, or (trifluoromethyl)phenyl group, or

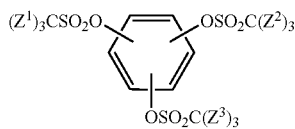

(17)

wherein $Z^1$, $Z^2$, and $Z^3$ individually represent a fluorine atom, chlorine atom, hydrogen atom, alkyl group, or aryl group, provided that three $Z^1$, $Z^2$, or $Z^3$ groups are either the same or different.

As examples of the sulfone compound, compounds of the following formula (18) can be given:

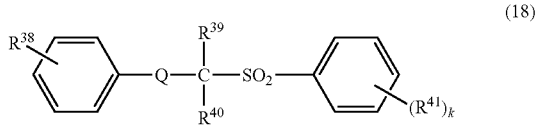

(18)

wherein Q represents —CO— or —$SO_2$—, $R^{38}$, $R^{39}$, $R^{40}$, and $R^{41}$ individually represent a halogen atom or an alkyl group, and k is an integer of 0-3, provided that two or more $R^{41}$ that may present may be either the same or different.

Of these acid generators, onium salts are particularly preferable.

The acid generators may be used either individually or in combination of two or more.

The amount of acid generators to be added is usually 20 parts by weight or less, and preferably 10 parts by weight or less, for 100 parts by weight of the polymer of the antireflection film-forming composition. If the amount of the acid generator exceeds 20 parts by weight, developability tends to decrease.

As other additives, a light absorber, preservative, defoaming agent, adhesion adjuvant agent, antiseptic agent, dye, pigment, and the like can be given.

Preparation of Antireflection Film-Forming Composition Solution

In order to form an antireflection film from the antireflection film-forming composition of the present invention, a prescribed amount of the composition is dissolved in a solvent to a solid content of 2-10 wt %, for example, and the solution is filtered through a filter with a pore size of about 0.2 μm, for example, to obtain a solution (hereinafter referred to as "antireflection film-forming composition solution"). This antireflection film-forming composition solution is applied to a resist film using an appropriate application method such as rotational coating, cast coating, and roll coating.

As the solvent used for preparing the antireflection film-forming composition solution, any solvent that can dissolve the components of the composition can be used. Examples of such a solvent include, in addition to water and monovalent alcohol such as methanol, ethanol, and isopropanol, ethylene glycol monomethyl ether acetate, ethylene glycol monoethyl ether acetate, diethylene glycol monomethyl ether, diethylene glycol monoethyl ether, diethylene glycol monobutyl ether, propylene glycol methyl ether acetate, propylene glycol ethyl ether acetate, propylene glycol propyl ether acetate, methyl ethyl ketone, cyclohexanone, methyl 2-hydroxypropionate, ethyl 2-hydroxypropionate, ethyl 2-hydroxy-2-methylpropionate, methyl 3-methoxypropionate, ethyl 3-ethoxypropionate, ethyl ethoxyacetate, ethyl oxyacetate, methyl 2-hydroxy-3-methylbutyrate, 3-methyl-3-methoxybutyl acetate, 3-methyl-3-methoxybutyl propionate, 3-methyl-3-methoxybutyl butyrate, ethyl acetate, butyl acetate, methyl 3-methoxypropionate, ethyl pyruvate, benzyl ethyl ether, dihexyl ether, acetonyl acetone, isophorone, caproic acid, caprylic acid, benzyl acetate, ethyl benzoate, diethyl oxalate, diethyl maleate, γ-butyrolactone, ethylene carbonate, propylene carbonate, ethylene glycol mono phenyl ether acetate, and the like.

These solvents may be used either individually or in combinations of two or more.

Of these solvents, a solvent containing 10 wt % or more water and/or monovalent alcohol is preferable.

Laminate

The laminate of the present invention comprises a resist film and an antireflection film formed from the antireflection film-forming composition on the resist film.

The laminate of the present invention can be formed by, for example, a method described in the method of forming a resist pattern which is described below.

In the laminate, the thickness of the antireflection film, which varies according to the wavelength of radiation used in the formation of resist patterns, the refractive index of the antireflection film, and the like, is an anisoploid of λ/4 m (wherein λ is the wavelength of radiation and m is the refractive index of the antireflection film), and preferably one or three times of λ/4 m.

Formation of Resist Pattern

The method for forming a resist pattern of the present invention comprises, in a process of forming a resist pattern by forming a resist film on the surface of a substrate, exposing the resist film to radiation, and developing the resist film, previously forming an antireflection film from the antireflection film-forming composition of the present invention on the resist film, exposing the resist film to radiation to form a prescribed pattern, developing the resist film, and removing the antireflection film.

As the resist used in the resist pattern forming method of the present invention, for example, a positive tone resist such as a novolak-type resist containing a quinonediazido compound and a chemically amplified positive tone or negative tone resist can be given.

In order to form a resist film from such a resist, the resist is dissolved, as required, in an appropriate solvent to a solid content of 5-10 wt %, for example, and the solution is filtered through a filter with a pore size of about 0.2 μm, for example, to obtain a resist solution. This resist solution is applied to a substrate such as a silicon wafer or an aluminum-coated wafer using an appropriate application method such as rotational coating, cast coating, and roll coating. The applied coating is usually prebaked and the solvent is evaporated to obtain a resist film. A commercially available resist solution can be used as is for the formation of a resist pattern.

The solvents previously mentioned in the description of the antireflection film-forming composition solution can be given as examples of the solvent used for preparing the resist solution.

Then, the antireflection film is formed by applying the antireflection film-forming composition solution to the resist film, followed usually by baking again. In this instance, the closer the thickness of the antireflection film to an anisoploid of λ/4 m (wherein λ is the wavelength of radiation and m is the refractive index of the antireflection film), the greater the antireflection effect on the upper side surface of the resist film.

To apply the antireflection film-forming composition solution to a resist film, an appropriate application method such as rotational coating, cast coating, and roll coating can be used.

In the present invention, prebaking after the application of the resist solution or baking after the application of the antireflection film-forming composition solution may be omitted for simplicity of the process.

The resist film is then exposed to radiation to obtain a prescribed pattern profile. Radiation used here can be appropriately selected according to the types of resist or the combination of the resist and the basic material blocking antireflection film from among visible rays; ultraviolet rays such as g-line and i-line; deep ultraviolet rays such as ArF excimer laser or KrF excimer laser; X-rays such as synchrotron radiation; and charged particle rays such as electron beams.

In this instance, baking after exposure (post exposure baking) is preferably carried out to improve resolution, pattern profile, developability, and the like of the resist. The temperature for the post exposure baking is appropriately adjusted according to the resist, usually in the range of about 50-200° C.

The resist film is then developed to obtain a desired resist pattern.

The developer used in the development can be appropriately selected according to the resist used. An alkaline developer is preferable. When developed using an alkaline developer, the resist film is usually washed after the development.

In the method for resist pattern formation of the present invention, a separate step for removing the antireflection film is not necessary, if an alkaline developer is used for the development. In the case of washing during development or after development, the antireflection film can be easily washed out together with the resist film. This is one important feature of the present invention.

As examples of the alkaline developer, alkaline aqueous solutions prepared by dissolving alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-[5.4.0]-7-undecene, and 1,5-diazabicyclo-[4.3.0]-5-nonene can given.

An appropriate amount of a water-soluble organic solvent such as alcohols including methanol and ethanol or surfactant can be added to these alkaline developer.

When developed using these alkaline developers, the resist film is usually washed with water after the development.

Although each component forming the antireflection film-forming composition of the present invention, relationship among the components, and methods for forming the laminate and resist pattern of the present invention have been discussed in detail in the above description, various modifications can be employed within the spirit of the present invention.

The antireflection film-forming composition of the present invention can be excellently applied to a resist film to form an antireflection film, while inhibiting generation of microbubbles. The antireflection film-forming composition exhibits superior wetting properties with resist films, can effectively inhibit invasion of basic substances in the atmosphere into the resist film, thereby preventing degradation of resist patterns, can sufficiently reduce the standing-wave effect by inhibiting reflection of radiations in the interface of the antireflection film and the resist film, and exhibits excellent solubility to water and alkaline developers.

According to the method for forming resist patterns of the present invention using this antireflection film-forming composition, the resist film is not affected by basic substances in the atmosphere and a resist pattern can be formed with a minimal dimensional fluctuation irrespective of a change in the time period from exposure to development, without being affected by the standing-wave effect. The dimensional fluctuation of the resist pattern can be remarkably reduced, even if there are steps on the surface of the substrate or there are variations on the composition and viscosity of the resist, or resist coating conditions, whereby fine and precise resist patterns can be constantly formed. Furthermore, the resist pattern forming method of the present invention exhibits excellent resolution, developability, pattern profile, and applicability, and the like.

Therefore, the antireflection film-forming composition of the present invention can greatly contribute particularly to the manufacture of high integrated circuits.

EXAMPLES

The present invention is described below in more detail by examples and comparative examples. However, these examples should not be construed as limiting the present invention. In the examples, part(s) and % refer to part(s) by weight and wt % unless otherwise indicated.

A chemically-amplified positive-tone resist for KrF excimer laser ("M20G" manufactured by JSR Corp.) is used as the resist in the examples and comparative examples.

Formation of resist patterns and evaluation of the performance of antireflection film were carried out according to the following methods.

Formation of Resist Pattern

The resist was applied to a silicon wafer with a diameter of eight inches by rotational coating and prebaked for 90 seconds on a hot plate at 140° C. to obtain a resist film with a thickness of 0.6 μm. Then, the antireflection film-forming composition solution was applied to the resist film by rotational coating to form an antireflection film with a thickness of 35-50 nm. A resist pattern was formed by exposing the resist to radiation for a prescribed period of time using a stepper ("NSR-S203B" manufactured by NIKON CORP. (wavelength of 248 nm)), immediately followed by post-exposure baking on a hot plate at 140° C. for 90 seconds, development using an aqueous solution of 2.38% tetramethylammonium hydroxide at 25° C. for one minute, washing with water, and drying.

Evaluation of Antireflection Film

Resolution:

Minimum dimensions of the resist pattern resolved were measured by a scanning electron microscope to determine the resolution.

Developability:

Scum of residues of the antireflection film or resist film and undeveloped areas were inspected by a scanning electron microscope. Development was regarded to be "Good" when scum and undeveloped areas were not present.

Pattern Profile and Basic Material Blocking Effect:

The cross-sectional shapes of resist patterns were inspected by a scanning electron microscope. If the cross-sectional shape has a shape of (a), (b), or (c), the pattern profile was judged to be "Good". When an eave as shown in (f) in FIG. 1 was not observed on the top of the pattern, the effect of blocking basic materials in the atmosphere was judged to be "Good".

Standing-Wave Prevention Effect:

Resist films with a thickness of 1.00-1.15 μm, each film having a thickness differing from other films by 0.01 μm, were formed on silicon wafers with a diameter of 6 inches. Then, an antireflection film was formed by the method described above. Each wafer was exposed to a different dose of radiation using the above-mentioned reduced projection exposure system, followed by post exposure baking and development, as described above, to obtain a resist pattern.

Each wafer was inspected by an optical microscope to determine the minimum exposure dose at which no film residue is left in spaces with a 100 μm width. The resulting minimum exposure dose was regarded as the sensitivity for each film thickness. The resulting maximum sensitivity ($E_{max}$) and minimum sensitivity ($E_{min}$) were applied to the following formula to determine the fluctuation of sensitivity according to film thickness change (a dimensional fluctuation) indicated by S in the following formula, which was used as an index of the standing-wave prevention effect. Resist films with S smaller than 10 were judged to exhibit "Good" standing-wave prevention effect.

$$S=(E_{max}-E_{min})\times 100/E_{max}$$

Microbubbles:

After forming a resist film on a silicon wafer, an antireflection film was formed in the same manner as above. The resulting antireflection film was observed using a defect inspection apparatus ("KLA2351" manufactured by KLA-Tencor Corp.) to inspect the presence or absence of microbubbles with a maximum dimension of 0.5 μm or more.

Defects After Development:

After forming a resist pattern on a silicon wafer using the above method, the resist was observed using a defect inspection system ("KLA2351" manufactured by KLA-Tencor Corp.) to inspect the presence or absence of defects due to microbubbles in the antireflection film after development.

Properties of polymers obtained by the synthesis examples and comparative synthesis examples were evaluated as follows.

Evaluation of Polymer (Salt) Properties

Mw:

Mw was measured by gel permeation chromatography (GPC) using GPC columns (manufactured by Tosoh Corp., G2000HXL×2, G3000HXL×1, G4000HXL×1) under the following conditions. Flow rate: 1.0 ml/minute, eluate: tetrahydrofuran, column temperature: 40° C., standard reference material: monodispersed polystyrene Copolymerization Ratio:

The copolymerization ratio of monomers was determined from the peak area ratio of the peaks originating from side chains of monomers in the absorption spectrum in $^1$H-NMR and $^{13}$C-NMR.

Synthesis Example 1

A separable flask equipped with a stirrer, a thermometer, and a cooling tube was charged with 300 parts of methanol and 50 parts of isopropyl alcohol. After bubbling nitrogen gas through the mixture for 15 minutes, 20 parts of 2-acrylamide-2-methylpropanesulfonic acid, 80 parts of 3-(perfluoro-n-butyl)-2-hydroxypropyl acrylate, and 0.5 part of 2,2'-azobis[N-(2-carboxyethyl)-2-methylpropioneamide] hydrate were added, and the internal temperature was increased to 45° C. After one hour, the internal temperature was increased to 60° C. and the mixture was reacted for eight hours. The reaction mixture was cooled to 25° C. and dried under vacuum to remove the solvent, thereby obtaining a copolymer.

The copolymer was confirmed to have an Mw of $4.5\times 10^3$ and a copolymerization ratio of 2-acrylamide-2-methylpropanesulfonic acid:3-(perfluoro-n-butyl)-2-hydroxypropyl acrylate=20:80. This copolymer is referred to as a "polymer (A-1)".

Synthesis Example 2

A separable flask equipped with a stirrer, a thermometer, and a cooling tube was charged with 300 parts of methanol and 50 parts of isopropyl alcohol. After bubbling nitrogen gas through the mixture for 15 minutes, 20 parts of allylsulfonic acid, 80 parts of 3-(perfluoro-n-butyl)-2-hydroxypropyl acrylate, and 0.5 part of 2,2'-azobis[N-(2-carboxyethyl)-2-methylpropioneamide] hydrate were added, and the internal temperature was increased to 45° C. After one hour, the internal temperature was increased to 60° C. and the mixture was reacted for eight hours. The reaction mixture was cooled to 25° C. and dried under vacuum to remove the solvent, thereby obtaining a copolymer.

The copolymer was confirmed to have an Mw of $3.5\times 10^3$ and a copolymerization ratio of allylsulfonic acid:3-(perfluoro-n-butyl)-2-hydroxypropyl acrylate=20:80. This copolymer is referred to as a "polymer (A-2)".

Synthesis Example 3

A separable flask equipped with a stirrer, a thermometer, and a cooling tube was charged with 300 parts of methanol and 50 parts of isopropyl alcohol. After bubbling nitrogen gas through the mixture for 15 minutes, 20 parts of vinylsulfonic acid, 80 parts of 3-(perfluoro-n-butyl)-2-hydroxypropyl acrylate, and 0.5 part of 2,2'-azobis[N-(2-carboxyethyl)-2-methylpropioneamide] hydrate were added, and the internal temperature was increased to 45° C. After one hour, the internal temperature was increased to 60° C. and the mixture was reacted for eight hours. The reaction mixture was cooled to 25° C. and dried under vacuum to remove the solvent, thereby obtaining a copolymer.

The copolymer was confirmed to have an Mw of $3.7\times 10^3$ and a copolymerization ratio of vinylsulfonic acid:3-(perfluoro-n-butyl)-2-hydroxypropyl acrylate=20:80. This copolymer is referred to as a "polymer (A-3)".

Synthesis Example 4

A separable flask equipped with a stirrer, a thermometer, and a cooling tube was charged with 300 parts of methanol and 50 parts of isopropyl alcohol. After bubbling nitrogen gas through the mixture for 15 minutes, 20 parts of 2-acrylamide-2-methylpropanesulfonic acid, 80 parts of 3-(perfluoro-n-hexyl)-2-hydroxypropyl acrylate, and 0.5 part of 2,2'-azobis[N-(2-carboxyethyl)-2-methylpropioneamide] hydrate were added, and the internal temperature was increased to 45° C. After one hour, the internal temperature was increased to 60° C. and the mixture was reacted for eight hours. The reaction mixture was cooled to 25° C. and dried under vacuum to remove the solvent, thereby obtaining a copolymer.

The copolymer was confirmed to have an Mw of $4.3\times 10^3$ and a copolymerization ratio of 2-acrylamide-2-methylpropanesulfonic acid:3-(perfluoro-n-hexyl)-2-hydroxypropyl acrylate=20:80. This copolymer is referred to as a "polymer (A-4)".

Synthesis Example 5

A separable flask equipped with a stirrer, a thermometer, and a cooling tube was charged with 300 parts of methanol and 50 parts of isopropyl alcohol. After bubbling nitrogen gas through the mixture for 15 minutes, 20 parts of allylsulfonic acid, 80 parts of 3-(perfluoro-n-hexyl)-2-hydroxypropyl acrylate, and 0.5 part of 2,2'-azobis[N-(2-carboxyethyl)-2-methylpropioneamide] hydrate were added, and the internal temperature was increased to 45° C. After one hour, the internal temperature was increased to 60° C. and the mixture was reacted for eight hours. The reaction mixture was cooled to 25° C. and dried under vacuum to remove the solvent, thereby obtaining a copolymer.

The copolymer was confirmed to have an Mw of $3.3 \times 10^3$ and a copolymerization ratio of allylsulfonic acid:3-(perfluoro-n-hexyl)-2-hydroxypropyl acrylate=20:80. This copolymer is referred to as a "polymer (A-5)".

Synthesis Example 6

A separable flask equipped with a stirrer, a thermometer, and a cooling tube was charged with 300 parts of methanol and 50 parts of isopropyl alcohol. After bubbling nitrogen gas through the mixture for 15 minutes, 20 parts of vinylsulfonic acid, 80 parts of 3-(perfluoro-n-hexyl)-2-hydroxypropyl acrylate, and 0.5 part of 2,2'-azobis[N-(2-carboxyethyl)-2-methylpropioneamide] hydrate were added, and the internal temperature was increased to 45° C. After one hour, the internal temperature was increased to 60° C. and the mixture was reacted for eight hours. The reaction mixture was cooled to 25° C. and dried under vacuum to remove the solvent, thereby obtaining a copolymer.

The copolymer was confirmed to have an Mw of $3.9 \times 10^3$ and a copolymerization ratio of vinylsulfonic acid:3-(perfluoro-n-hexyl)-2-hydroxypropyl acrylate=20:80. This copolymer is referred to as a "polymer (A-6)".

Synthesis Example 7

A separable flask equipped with a stirrer, a thermometer, and a cooling tube was charged with 300 parts of methanol and 50 parts of isopropyl alcohol. After bubbling nitrogen gas through the mixture for 15 minutes, 20 parts of 2-acrylamide-2-methylpropanesulfonic acid, 80 parts of 3-(perfluoro-3-methylbutyl)-2-hydroxypropyl acrylate, and 0.5 part of 2,2'-azobis[N-(2-carboxyethyl)-2-methylpropioneamide] hydrate were added, and the internal temperature was increased to 45° C. After one hour, the internal temperature was increased to 60° C. and the mixture was reacted for eight hours. The reaction mixture was cooled to 25° C. and dried under vacuum to remove the solvent, thereby obtaining a copolymer.

The copolymer was confirmed to have an Mw of $2.9 \times 10^3$ and a copolymerization ratio of 2-acrylamide-2-methylpropanesulfonic acid:3-(perfluoro-3-methylbutyl)-2-hydroxypropyl acrylate=20:80. This copolymer is referred to as a "polymer (A-7)".

Synthesis Example 8

A separable flask equipped with a stirrer, a thermometer, and a cooling tube was charged with 300 parts of methanol and 50 parts of isopropyl alcohol. After bubbling nitrogen gas through the mixture for 15 minutes, 20 parts of allylsulfonic acid, 80 parts of 3-(perfluoro-3-methylbutyl)-2-hydroxypropyl acrylate, and 0.5 part of 2,2'-azobis[N-(2-carboxyethyl)-2-methylpropioneamide] hydrate were added, and the internal temperature was increased to 45° C. After one hour, the internal temperature was increased to 60° C. and the mixture was reacted for eight hours. The reaction mixture was cooled to 25° C. and dried under vacuum to remove the solvent, thereby obtaining a copolymer.

The copolymer was confirmed to have an Mw of $2.8 \times 10^3$ and a copolymerization ratio of allylsulfonic acid:3-(perfluoro-3-methylbutyl)-2-hydroxypropyl acrylate=20:80. This copolymer is referred to as a "polymer (A-8)".

Synthesis Example 9

A separable flask equipped with a stirrer, a thermometer, and a cooling tube was charged with 300 parts of methanol and 50 parts of isopropyl alcohol. After bubbling nitrogen gas through the mixture for 15 minutes, 20 parts of vinylsulfonic acid, 80 parts of 3-(perfluoro-3-methylbutyl)-2-hydroxypropyl acrylate, and 0.5 part of 2,2'-azobis[N-(2-carboxyethyl)-2-methylpropioneamide] hydrate were added, and the internal temperature was increased to 45° C. After one hour, the internal temperature was increased to 60° C. and the mixture was reacted for eight hours. The reaction mixture was cooled to 25° C. and dried under vacuum to remove the solvent, thereby obtaining a copolymer.

The copolymer was confirmed to have an Mw of $3.0 \times 10^3$ and a copolymerization ratio of vinylsulfonic acid:3-(perfluoro-3-methylbutyl)-2-hydroxypropyl acrylate=20:80. This copolymer is referred to as a "polymer (A-9)".

Comparative Synthesis Example 1

A separable flask equipped with a stirrer, a thermometer, and a cooling tube was charged with 170 parts of methanol. After bubbling nitrogen gas through the mixture for 15 minutes, 10 parts of 2-acrylamide-2-methylpropanesulfonic acid, 60 parts of 2,2,2-trifluoroethyl acrylate, 30 parts of ethyl acrylate, and 4 parts of 2,2'-azobisisobutylonitrile were added, and the internal temperature was increased to 60° C. After one hour, the internal temperature was increased to 80° C. and the mixture was reacted for four hours. The reaction mixture was cooled to 25° C. and dried under vacuum to remove the solvent, thereby obtaining a copolymer.

The copolymer was confirmed to have an Mw of $1.5 \times 10^4$ and a copolymerization ratio of 2-acrylamide-2-methylpropanesulfonic acid:2,2,2-trifluoroethylacrylate:ethyl acrylate=10:59:31. This copolymer is referred to as a "polymer (a-1)".

Comparative Synthesis Example 2

A separable flask equipped with a stirrer, a thermometer, and a cooling tube was charged with 170 parts of methanol. After bubbling nitrogen gas through the mixture for 15 minutes, 20 parts of 2-acrylamide-2-methylpropanesulfonic acid, 80 parts of 2,2,3,3,3-pentafluoropropyl methacrylate, and 4 parts of 2,2'-azobisisobutylonitrile were added, and the internal temperature was increased to 60° C. After one hour, the internal temperature was increased to 80° C. and the mixture was reacted for four hours. The reaction mixture was cooled to 25° C. and dried under vacuum to remove the solvent, thereby obtaining a copolymer.

The copolymer was confirmed to have an Mw of $0.5 \times 10^4$ and a copolymerization ratio of 2-acrylamide-2-methylpropanesulfonic acid:2,2,3,3,3-pentafluoropropyl methacrylate=20:80. This copolymer is referred to as a "polymer (a-2)".

Comparative Synthesis Example 3

A separable flask equipped with a stirrer, a thermometer, and a cooling tube was charged with 170 parts of methanol. After bubbling nitrogen gas through the mixture for 15 minutes, 10 parts of 2-methacrylamide-2-methylpropanesulfonic acid, 50 parts of 2,2,2-trifluoroethyl acrylate, 40 parts of methyl methacrylate, and 4 parts of 2,2'-azobisisobutyronitrile were added, and the internal temperature was increased to 60° C. After one hour, the internal temperature was increased to 70° C. and the mixture was reacted for five hours. The reaction mixture was cooled to 25° C. and dried under vacuum to remove the solvent, thereby obtaining a copolymer.

The copolymer was confirmed to have an Mw of $3.8 \times 10^4$ and a copolymerization ratio of 2-methacrylamide-2-methylpropanesulfonic acid:2,2,2-trifluoroethylacrylate:methyl methacrylate=10:50:40.

The copolymer obtained was dissolved in an aqueous solution of ammonia in a mol amount equivalent to the initially charged amount of 2-methacylamide-2-methylpropane sulfonic acid to obtain a solution of the copolymer salt with a solid component content of 10%. This copolymer is referred to as a "polymer (a-3)".

Examples 1-9

Antireflection film-forming composition solutions were obtained by adding water to each polymer shown in Table 1 to make a solid component content of 3% and filtering the mixture through a membrane filter with a pore diameter of 0.2 μm.

The resist patterns were formed using the antireflection film-forming composition solutions to evaluate the performance of the antireflection films. The evaluation results are shown in Table 1.

Examples 10-12

Antireflection film-forming composition solutions were obtained by adding water to mixtures of 100 parts of each of the polymers shown in Table 1 and 10 parts of "Surfynol 465" as a surfactant to make a solid component content of 3% and filtering the mixture through a membrane filter with a pore diameter of 0.2 μm.

The resist patterns were formed using the antireflection film-forming composition solutions to evaluate the performance of the antireflection films. The evaluation results are shown in Table 1.

Comparative Examples 1-3

Antireflection film-forming composition solutions were obtained by adding water to each polymer shown in Table 1 to make a solid component content of 3% and filtering the mixture through a membrane filter with a pore diameter of 0.2 μm.

The resist patterns were formed using the antireflection film-forming composition solutions to evaluate the performance of the antireflection films. The evaluation results are shown in Table 1.

TABLE 1

| | Example | | | | | | | | | | | | Comparative Example | | |
|---|---|---|---|---|---|---|---|---|---|---|---|---|---|---|---|
| | 1 | 2 | 3 | 4 | 5 | 6 | 7 | 8 | 9 | 10 | 11 | 12 | 1 | 2 | 3 |
| Polymer | A-1 | A-2 | A-3 | A-4 | A-5 | A-6 | A-7 | A-8 | A-9 | A-1 | A-3 | A-6 | a-1 | a-2 | a-3 |
| Resolution (μm) | 0.25 | 0.25 | 0.25 | 0.25 | 0.25 | 0.25 | 0.25 | 0.25 | 0.25 | 0.25 | 0.25 | 0.25 | 0.25 | 0.25 | 0.25 |
| Developability | Good | Good | Good | Good | Good | Good | Good | Good | Good | Good | Good | Good | Good | Good | Good |
| Pattern profile | Good | Good | Good | Good | Good | Good | Good | Good | Good | Good | Good | Good | Good | Good | Good |
| Basic material blocking effect | Good | Good | Good | Good | Good | Good | Good | Good | Good | Good | Good | Good | Good | Good | Good |
| Standing-wave prevention effect | Good | Good | Good | Good | Good | Good | Good | Good | Good | Good | Good | Good | Good | Good | Good |
| Microbubbles | None | None | None | None | None | None | None | None | None | None | None | None | Present | Present | Present |
| Defects after development | None | None | None | None | None | None | None | None | None | None | None | None | Present | Present | Present |

The invention claimed is:

1. An antireflection film-forming composition comprising a copolymer having at least one recurring unit of the following formula (2) and/or at least one recurring unit of the following formula (3) and at least one recurring unit of the following formula (4):

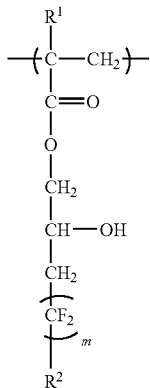
(2)

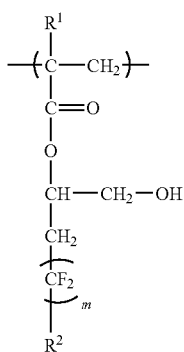
(3)

wherein R1 and R2 individually represent a hydrogen atom, a fluorine atom, or a monovalent organic group and m is an integer of 1-20,

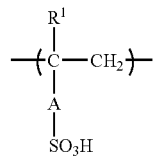
(4)

wherein R1 represents a hydrogen atom, a fluorine atom, or a monovalent organic group and A represents a divalent coupling means.

2. The antireflection film-forming composition according to claim 1, wherein the recurring unit represented by the formula (4) has at least one recurring unit originating from a compound selected from the group consisting of vinylsulfonic acid, allylsulfonic acid, and 2-acrylamide-2-methylpropanesulfonic acid.

3. The antireflection film-forming composition according to claim 1, further comprising a surfactant.

4. The antireflection film-forming composition according to claim 3, wherein the surfactant has a solubility in water at 20° C. of 0.01 wt % or more.

5. The antireflection film-forming composition according to claim 4, wherein the surfactant is added in an amount of 0.001-50 wt % for the amount of the polymer.

6. The antireflection film-forming composition according to claim 4, wherein the surfactant is added in an amount of 0.001-50 wt % for the amount of the polymer.

7. The antireflection film-forming composition according to claim 2, further comprising a surfactant.

8. A laminate comprising a resist film and an antireflection film formed from the antireflection film-forming composition according to claim 1 on the resist film.

9. A laminate comprising a resist film and an antireflection film formed from the antireflection film-forming composition according to claim 2 on the resist film.

10. A process of forming a resist pattern by forming a resist film on the surface of a substrate comprising previously forming an antireflection film from the antireflection film-forming composition according to claim 1 on the resist film, exposing the resist film to radiation to form a prescribed pattern, developing the resist film, and removing the antireflection film.

11. The process according to claim 10, wherein the resist film is developed using an alkaline developer to remove simultaneously both the antireflection film and the resist film in the development process.

12. A process of forming a resist pattern by forming a resist film on the surface of a substrate, comprising previously forming an antireflection film from the antireflection film-forming composition according to claim 2 on the resist film, exposing the resist film to radiation to form a prescribed pattern, developing the resist film, and removing the antireflection film.

* * * * *